(12) United States Patent
Okada (10) Patent No.: US 9,397,615 B2
(45) Date of Patent: Jul. 19, 2016

(54) HARMONIC REJECTION POWER AMPLIFIER

(71) Applicant: Panasonic Corporation, Osaka (JP)

(72) Inventor: Eiji Okada, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 34 days.

(21) Appl. No.: 14/620,860

(22) Filed: Feb. 12, 2015

(65) Prior Publication Data

US 2015/0244323 A1    Aug. 27, 2015

(30) Foreign Application Priority Data

Feb. 27, 2014    (JP) ................ 2014-036771

(51) Int. Cl.
| | |
|---|---|
| H03F 1/30 | (2006.01) |
| H03F 1/02 | (2006.01) |
| H03F 1/22 | (2006.01) |
| H03F 3/195 | (2006.01) |
| H03F 3/21 | (2006.01) |
| H03F 3/24 | (2006.01) |
| H03F 3/72 | (2006.01) |
| H03F 3/217 | (2006.01) |

(52) U.S. Cl.
CPC .............. *H03F 1/0277* (2013.01); *H03F 1/223* (2013.01); *H03F 3/195* (2013.01); *H03F 3/211* (2013.01); *H03F 3/2176* (2013.01); *H03F 3/245* (2013.01); *H03F 3/72* (2013.01); *H03F 2200/171* (2013.01); *H03F 2200/451* (2013.01); *H03F 2203/7215* (2013.01)

(58) Field of Classification Search
CPC ..................................... H03F 1/30; H03F 3/04
USPC .......................... 330/297, 288; 323/315, 316
See application file for complete search history.

(56) References Cited

U.S. PATENT DOCUMENTS

| | | | | |
|---|---|---|---|---|
| 6,914,491 B2* | 7/2005 | Derksen | ............... | H03L 7/0891 327/156 |
| 7,061,307 B2* | 6/2006 | Iroaga | ..................... | G05F 3/262 323/315 |
| 7,551,028 B1* | 6/2009 | Cyrusian | ................. | H03F 3/217 330/10 |
| 8,513,995 B2* | 8/2013 | Wang | ...................... | H03L 7/091 327/150 |
| 2010/0052792 A1 | 3/2010 | Nose et al. | | |
| 2012/0064850 A1 | 3/2012 | Matsui | | |
| 2013/0027119 A1* | 1/2013 | Mahadevan | ............ | H03L 7/091 327/531 |
| 2015/0070199 A1* | 3/2015 | Dedic | .................... | H03M 1/10 341/120 |

FOREIGN PATENT DOCUMENTS

| | | |
|---|---|---|
| JP | 2012-065017 | 3/2012 |
| WO | 2008/032782 | 3/2008 |

* cited by examiner

*Primary Examiner* — Henry Choe
(74) *Attorney, Agent, or Firm* — Greenblum & Bernstein, P.L.C.

(57) ABSTRACT

A power amplifier is provided that generates timing signals which respectively turn on or off switches for respectively opening or closing current paths for current sources and which have same duty ratio and different phases and that adjusts current values for the current sources based on phase differences among the timing signals.

6 Claims, 11 Drawing Sheets

THIRD-ORDER HARMONICS

FIG. 7A

PHASE VARIATION ABSENT

FIG. 7B

PHASE VARIATION PRESENT
(BEFORE CORRECTION)

FIG. 7C

PHASE VARIATION PRESENT
(AFTER CORRECTION)

| INDEX | LOWER LIMIT | CENTER | UPPER LIMIT |
|---|---|---|---|
| 0 | 0.70 | 0.72 | 0.74 |
| 1 | 0.74 | 0.76 | 0.78 |
| 2 | 0.78 | 0.80 | 0.82 |
| 3 | 0.82 | 0.84 | 0.86 |
| 4 | 0.86 | 0.88 | 0.90 |
| 5 | 0.90 | 0.92 | 0.94 |
| 6 | 0.94 | 0.96 | 0.98 |
| 7 | 0.98 | 1.00 | 1.02 |
| 8 | 1.02 | 1.04 | 1.06 |
| 9 | 1.06 | 1.08 | 1.10 |
| 10 | 1.10 | 1.12 | 1.14 |
| 11 | 1.14 | 1.16 | 1.18 |
| 12 | 1.18 | 1.20 | 1.22 |
| 13 | 1.22 | 1.24 | 1.26 |
| 14 | 1.26 | 1.28 | 1.30 |
| 15 | 1.30 | 1.32 | 1.34 |

FIG. 10B

SWITCH CHANGEOVER CONTROL SIGNAL A

| INDEX | | $\beta$ [deg] | | | | | | |
|---|---|---|---|---|---|---|---|---|
| | | −48 | −47 | −46 | −45 | −44 | −43 | −42 |
| $\alpha$ [deg] | 42 | 3 | 4 | 6 | 7 | 9 | 10 | 11 |
| | 43 | 3 | 4 | 6 | 7 | 9 | 10 | 11 |
| | 44 | 3 | 4 | 6 | 7 | 8 | 10 | 11 |
| | 45 | 3 | 4 | 6 | 7 | 8 | 10 | 11 |
| | 46 | 3 | 5 | 6 | 7 | 8 | 10 | 11 |
| | 47 | 4 | 5 | 6 | 7 | 8 | 9 | 11 |
| | 48 | 4 | 5 | 6 | 7 | 8 | 10 | 11 |

FIG. 10C

SWITCH CHANGEOVER CONTROL SIGNAL C

| INDEX | | $\beta$ [deg] | | | | | | |
|---|---|---|---|---|---|---|---|---|
| | | −48 | −47 | −46 | −45 | −44 | −43 | −42 |
| $\alpha$ [deg] | 42 | 11 | 11 | 11 | 11 | 11 | 11 | 11 |
| | 43 | 10 | 9 | 10 | 10 | 10 | 10 | 10 |
| | 44 | 8 | 8 | 8 | 8 | 8 | 9 | 9 |
| | 45 | 7 | 7 | 7 | 7 | 7 | 7 | 7 |
| | 46 | 6 | 6 | 6 | 6 | 6 | 6 | 6 |
| | 47 | 5 | 5 | 5 | 4 | 4 | 4 | 4 |
| | 48 | 4 | 4 | 3 | 3 | 3 | 3 | 3 |

FIG. 14

HARMONIC REJECTION POWER AMPLIFIER

BACKGROUND

1. Technical Field

The present disclosure relates to a power amplifier.

2. Description of the Related Art

There is a power amplifier as a circuit that outputs signals of which amplitude has been amplified for emission of radio waves from an antenna, for instance.

Figure 11:
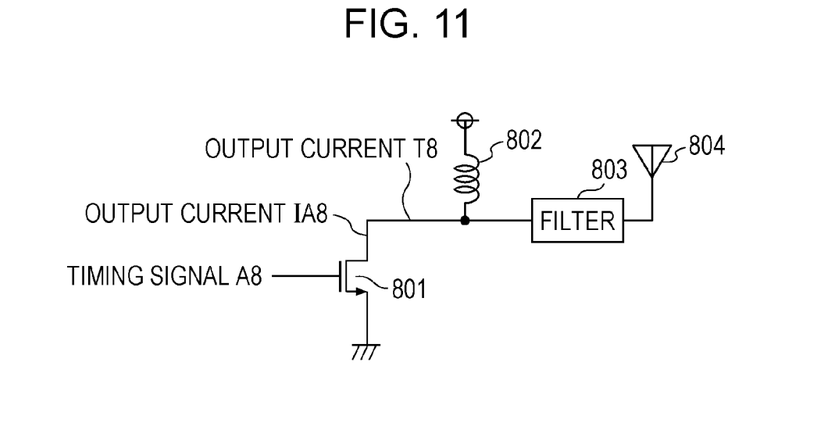
FIG. 11 illustrates a configuration of a conventional power amplifier.

As the power amplifier, as illustrated in FIG. 11, a circuit which is composed of an N-channel MOS transistor 801, an inductor 802, and a band-pass filter 803 and in which pulse waves are used as input signals is widely used. In this configuration, however, output of the power amplifier has a waveform similar to the input pulse and includes harmonics.

Figure 12:
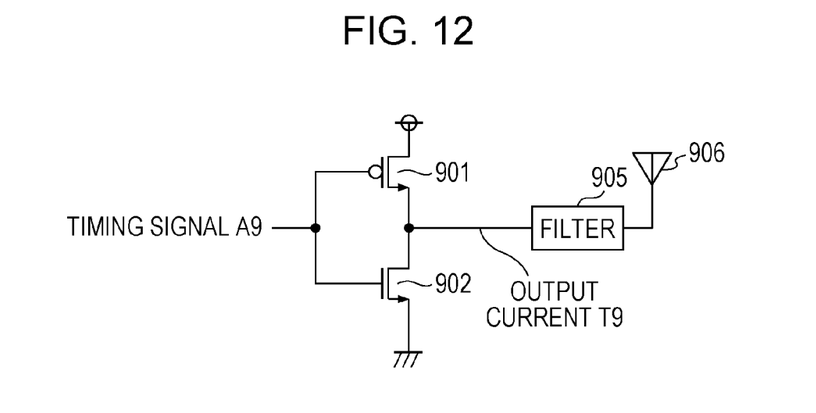
FIG. 12 illustrates a configuration of a first example of a conventional inverter-type power amplifier.

Apart from FIG. 11, there is a pulse-type power amplifier using an inverter that is composed of an N-channel MOS transistor 902 and a P-channel MOS transistor 901, as illustrated in FIG. 12. In this configuration as well, harmonics are generated in output.

In the past, a power amplifier that synthesizes output of a plurality of amplifiers each receive pulse waves in order to reduce odd harmonics has been proposed (see International Publication No. 2008/032782, for instance). A duty ratio and a phase of pulse wave that are received by an amplifier are set independently of duty ratios and phases of pulse waves received by other amplifiers.

Figure 13:
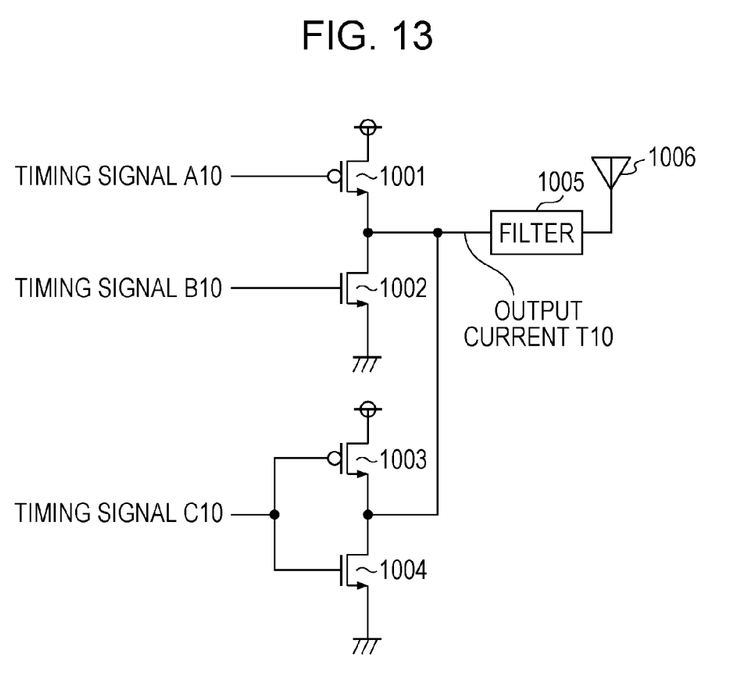
FIG. 13 illustrates a configuration of a second example of a conventional inverter-type power amplifier.
Figure 14:
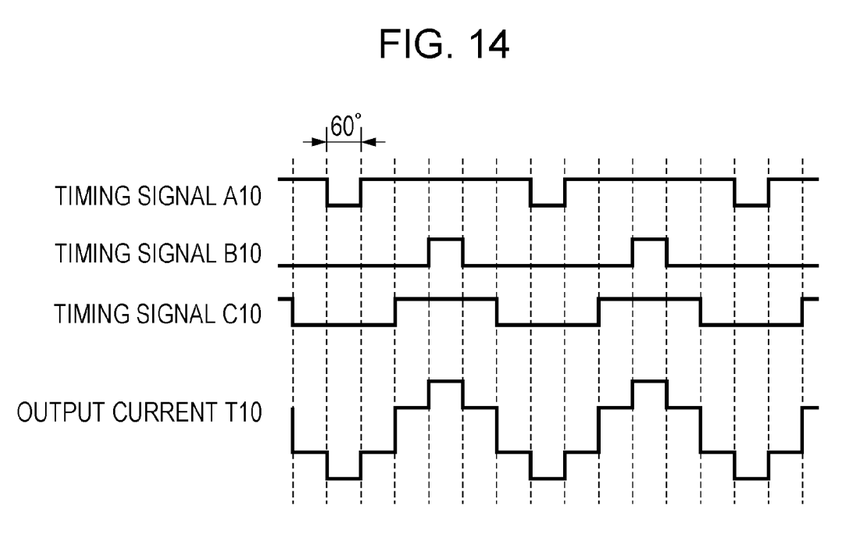
FIG. 14 illustrates operations of the second example of the conventional inverter-type power amplifier.

FIG. 13 is a circuit diagram of the power amplifier disclosed in International Publication No. 2008/032782. FIG. 14 is a timing diagram illustrating signal waveforms in components of the power amplifier of FIG. 13. The power amplifier of FIG. 13 synthesizes output of an inverter composed of an N-channel MOS transistor 1001 and a P-channel MOS transistor 1002 and output of an inverter composed of an N-channel MOS transistor 1003 and a P-channel MOS transistor 1004. As illustrated in FIG. 14, a duty ratio and a phase of each of timing signals A10, B10, and C10 to the components are set independently of duty ratios and phases of other timing signals, and output waveform is formed in a waveform similar to a sine wave, so that the odd harmonics are reduced.

SUMMARY

The power amplifier of FIG. 13, however, requires a timing generator circuit that generates a plurality of timing signals A10, B10, and C10 having the different duty ratios in order to reduce the harmonics. As disclosed in International Publication No. 2008/032782, the timing generator circuit is a circuit having a logic circuit in which AND circuits and OR circuits are combined, for instance. As frequencies of the signals are increased in the timing generator circuit, therefore, influence of time delay due to devices or interconnection is increased and timing of rise and fall of the timing signals is shifted from ideal thereof. Thus, the power amplifier of FIG. 13 has a problem in that the shift of the timing signals reduces an effect of the reduction in the odd harmonics.

One non-limiting and exemplary embodiment provides a power amplifier that is capable of reducing odd harmonics with facility even on condition of high frequencies.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature a power amplifier including n current sources (n is an integer equal to or greater than three) that provide variable constant currents, n switches that respectively open and close current paths for the n current sources, a generator that generates n timing signals that respectively turn on or off the n switches and that have the same duty ratio and different phases, a detector that detects phase differences among the n timing signals, and a calculator that calculates current adjustment values for adjustment in current values for the n current sources based on the phase differences.

According to the disclosure, the duty ratios of the n timing signals are equalized and thus the odd harmonics can be reduced with facility even on condition of high frequencies.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Hereinbelow, embodiments of the disclosure will be described in detail with reference to the drawings.

First Embodiment

Figure 1:
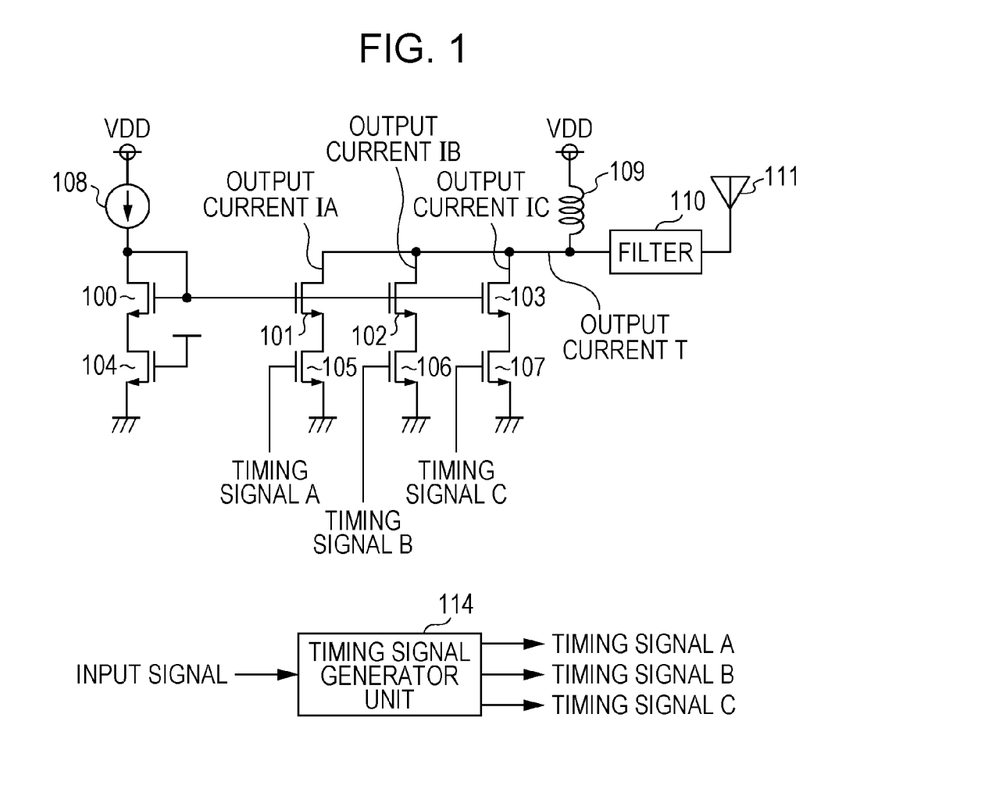
FIG. 1 illustrates a configuration of a power amplifier according to a first embodiment of the disclosure.

FIG. 1 illustrates a configuration of a power amplifier according to a first embodiment of the disclosure. The power amplifier according to the first embodiment is a harmonic rejection power amplifier that reduces harmonics.

In FIG. 1, the power amplifier according to the first embodiment includes a reference current source 108, a plurality of N-channel metal-oxide-semiconductor field-effect transistors (NMOS transistors) 100 through 103 that constitute current mirror circuits, a plurality of NMOS transistors 104 through 107 as switches, a coil 109 for pull-up, a band-pass filter 110, and a timing signal generator unit 114 as a generator unit. The power amplifier, of which an output terminal is connected to an antenna 111, outputs a current with large amplitude to the antenna 111.

In FIG. 1, the reference current source 108 and the NMOS transistors 100, 101, 102, and 103 constitute the current mirror circuits. The reference current source 108 is a constant current source, for instance. When a voltage of a given value or higher is applied between drain and source of each of the NMOS transistors 101, 102, and 103, the NMOS transistors 101, 102, and 103 transfer a current flowing through the NMOS transistor 100 as a transfer source, by predetermined mirror ratios and pass the current through themselves. The three current mirror circuits ((100, 101), (100, 102), and (100, 103)) correspond to three current sources.

The drain terminals of the NMOS transistors 101, 102, and 103 are connected to a pull-up terminal of the coil 109 and an input terminal of the band-pass filter 110. The other end of the band-pass filter 110 is the output terminal of the power amplifier and the output terminal is connected to the antenna 111.

The NMOS transistors 105, 106, and 107, which are the switches, are turned on/off by timing signals A, B, and C sent from the timing signal generator unit 114. The NMOS transistors 105, 106, and 107 are respectively connected between the source terminals of the NMOS transistors 101, 102, and 103 carrying the transfer currents and ground in order to open and close current paths therefor. The NMOS transistor 104 in a transfer source circuit is a dummy switch for equalizing characteristics of transfer destinations with characteristics of the transfer source and is in on state.

The NMOS transistors 101, 102, and 103 are formed with W/L ratios of the NMOS transistors 101, 102, and 103 set at $1:2^{1/2}:1$ in order that ratio of the currents flowing through the NMOS transistors 101, 102, and 103 may be $1:2^{1/2}:1$. Herein, W represents gate width of the transistor and L represents gate length thereof.

The timing signal generator unit 114 generates the timing signals A, B, and C that turn on/off the NMOS transistors 105, 106, and 107 which are the switches. The timing signal generator unit 114 modulates frequencies of the timing signals A, B, and C in accordance with input signals and frequency of an output current from the power amplifier is thereby modulated.

Resistance of the coil 109 is sufficiently small for direct-current component of the output current T and sufficiently large for high-frequency component of the output current T. During operations of the power amplifier, the coil 109 supplies direct currents from a power-supply line VDD to the circuits. In the total output current T that flows through the NMOS transistors 101, 102, and 103, the direct-current component flows through the coil 109 and the high-frequency component is outputted through the band-pass filter 110 to the antenna 111.

Figure 2:
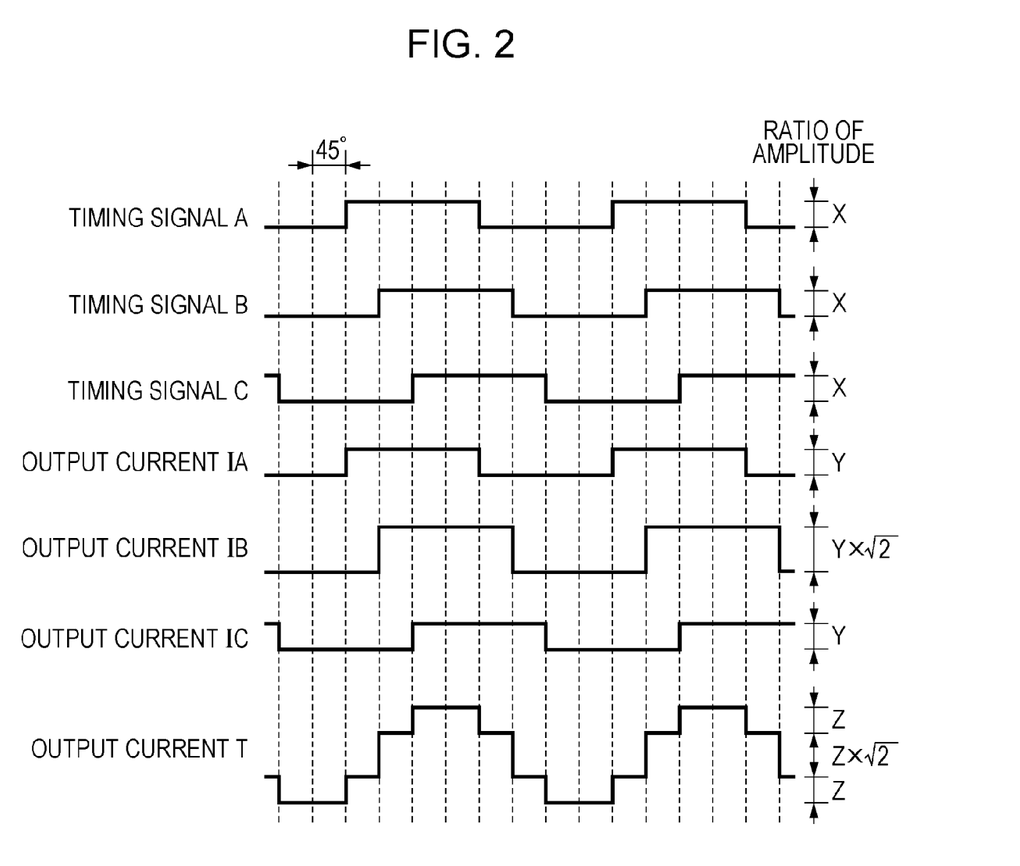
FIG. 2 illustrates operations of the power amplifier according to the first embodiment of the disclosure.

FIG. 2 is a timing diagram illustrating operations of the power amplifier of the first embodiment.

The timing signals A, B, and C in the first embodiment have the same duty ratio and different phases. In FIG. 2, the timing signals A, B, and C all have the duty ratio of 50% and have phase shifts therebetween of 45 degrees. That is, the phase of the timing signal B is shifted by 45 degrees and the phase of the timing signal C is shifted by 90 degrees with respect to the phase of the timing signal A. For instance, the timing signal A rises at the phase of 0 degrees, the timing signal B rises at the phase of −45 degrees, and the timing signal C rises at the phase of −90 degrees. The timing signals A, B, and C have the same high-level voltage value.

In waveforms of output currents IA, IB, and IC that flow through the drain terminals of the NMOS transistors 101, 102, and 103, the output currents IA, IB, and IC each have a specified current value in high-level periods of the timing signals A, B, and C, respectively. The W/L ratios of the NMOS transistors 101, 102, and 103 set at $1:2^{1/2}:1$, as described above, result in magnitude ratio of the output currents IA, IB, and IC of $1:2^{1/2}:1$.

The output current T is total of the output currents IA, IB, and IC and the high-frequency component thereof is outputted through the band-pass filter 110 to the antenna 111. Conversion of the waveform of the output current T into a frequency spectrum reveals that third-order and fifth-order harmonics are reduced.

According to the power amplifier of the first embodiment, as described above, the output current T of which odd harmonics are reduced is obtained by use of the plurality of timing signals A, B, and C with the phases shifted with the same duty ratio. Thus duty conversion circuits can be omitted and the odd harmonics can be reduced with facility even on condition of high frequencies.

The power amplifier of the first embodiment, having an open drain configuration, is capable of outputting high power by setting large voltage amplitude for the output signals.

The configuration illustrated specifically in FIG. 1 may be modified in various manners.

Figure 3:
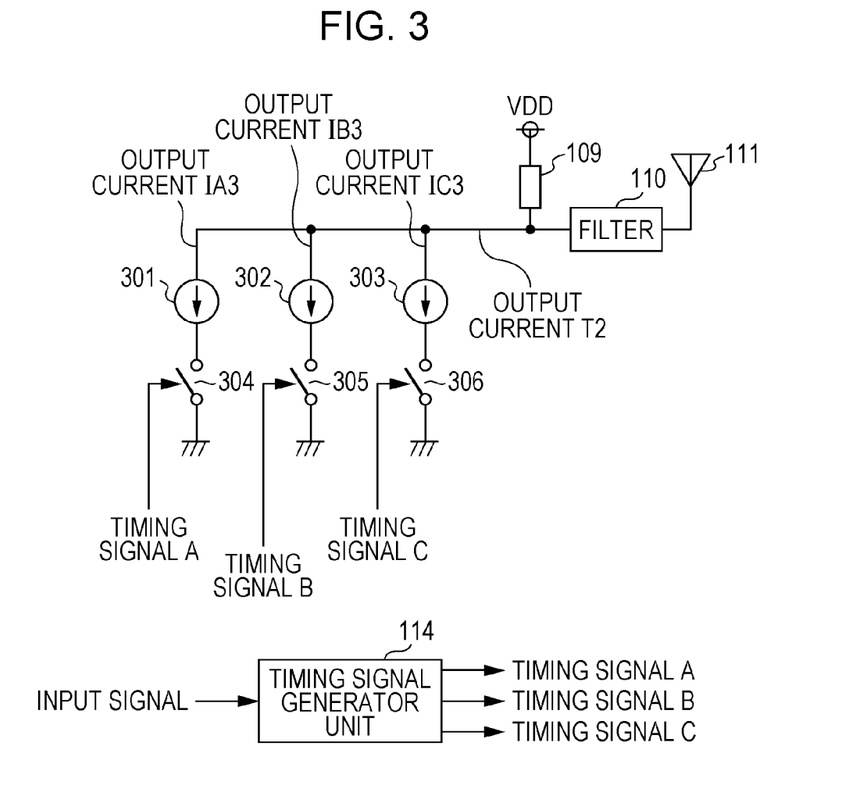
FIG. 3 illustrating a concept of the power amplifier according to the first embodiment of the disclosure.

FIG. 3 is a conceptual diagram illustrating the power amplifier according to the first embodiment of the disclosure.

Though the three current mirror circuits ((100, 101), (100, 102), and (100, 103)) are used as the three current sources in the power amplifier of FIG. 1, for instance, current sources 301, 302, and 303 having similar functions may be used instead as illustrated in FIG. 3. Though the three NMOS transistors 105, 106, and 107 are used as the three switches in the power amplifier of FIG. 1, bipolar transistors 304, 305, and 306 may be used as elements having similar functions, for instance.

Figure 4:
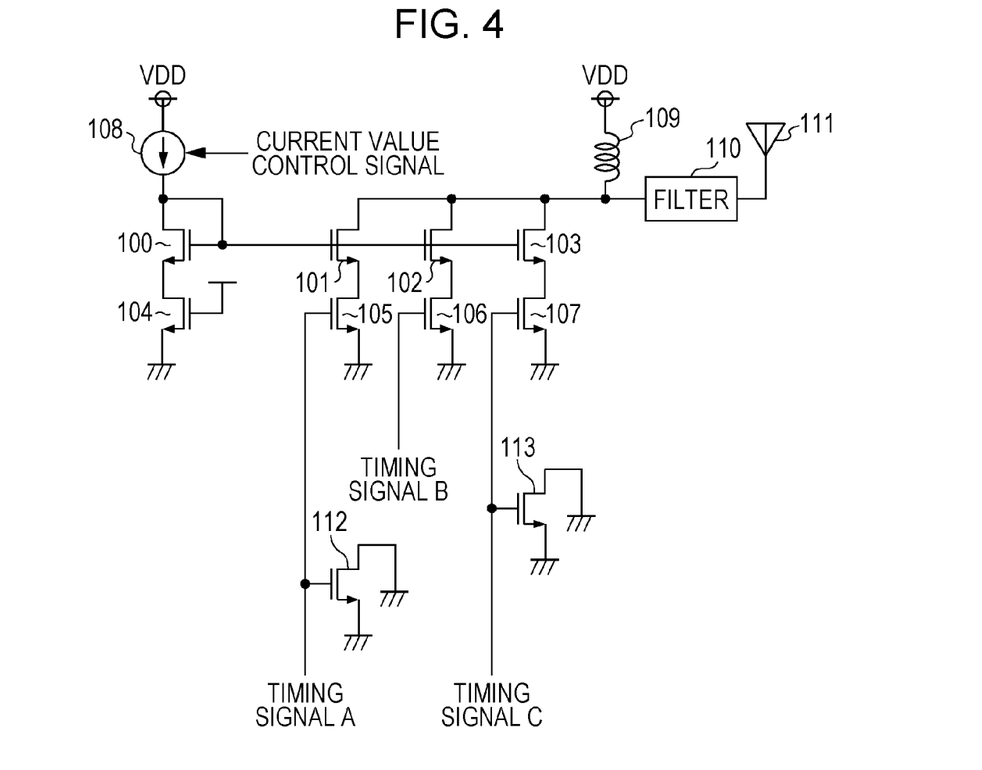
FIG. 4 illustrates a configuration of a modification of the first embodiment of the disclosure.

FIG. 4 is a configuration of a current amplifier according to a modification of the first embodiment.

Though it has been explained that amount of current for the reference current source 108 is fixed in the power amplifier of FIG. 1, the amount of current for the reference current source 108 may be adjusted by current value control signal as illustrated in FIG. 4. By this configuration, amplitude of the output current T can be changed. The change in the amplitude may be used for switching of signal level or for amplitude modulation of transmit signals.

Figure 5:
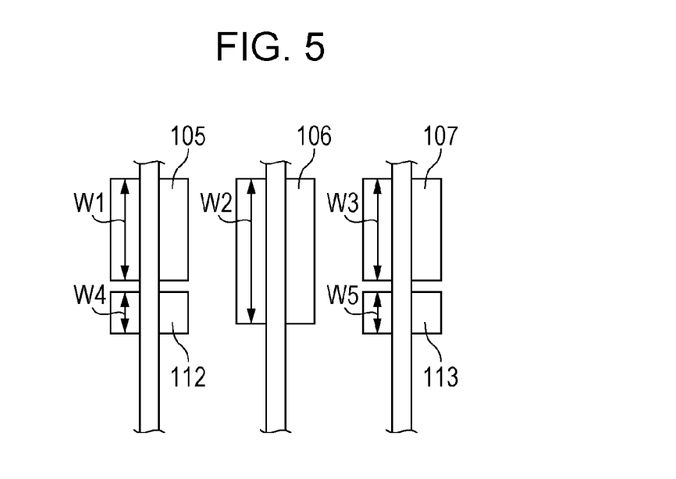
FIG. 5 illustrates sizes of NMOS transistors in FIG. 4.

FIG. 5 is a diagram illustrating sizes of the NMOS transistors in FIG. 4.

For the NMOS transistors 104, 105, 106, and 107 that are the switches in the power amplifier of FIG. 1, channel sizes are preferably designed in accordance with the ratio of the current values in order to equalize current densities of the currents flowing through the NMOS transistors 104, 105, 106, and 107. On condition that the ratio of the current values is $1:2^{1/2}:1$, as illustrated in FIG. 5, for instance, gate widths W1, W2, and W3 of the NMOS transistors 105, 106, and 107 are preferably set in the ratio of $1:2^{1/2}:1$ (with uniform gate length).

In the above configuration, however, it is difficult to keep constant gate loads (parasitic capacitance) of the NMOS transistors 105, 106, and 107 that are the switches. In generation of the timing signals A, B, and C under the same conditions, therefore, change in waveforms of rise and fall of the timing signals A, B, and C may cause errors in on/off timing of the NMOS transistors 105, 106, and 107.

In order to prevent the timing errors, the configuration of FIG. 5 includes load adjusting NMOS transistors 112 and 113 for adjustment in difference in size between the small-sized NMOS transistors 105, 107 and the large-sized NMOS transistor 106. Gate terminals of the NMOS transistors 105 and 107 are connected to gate terminals of the load adjusting NMOS transistors 112 and 113, respectively. Source terminals and drain terminals of the load adjusting NMOS transistors 112 and 113 are connected to equipotential points (ground, for instance) so that inflow of the currents into the load adjusting NMOS transistors 112 and 113 is reduced.

Gate widths W4 and W5 of the load adjusting MOS transistor 112 and 113 are preferably set so that W1+W4≈W2≈W3+W5 holds, with gate lengths thereof set the same as the gate length of the NMOS transistors 105, 106, and 107, for instance.

Such a configuration generally equalizes loads (capacities) of three gate wires of the NMOS transistors 105, 106, and 107 which loads are calculated from side of the timing signal generator unit 114. By the timing signals A, B, and C that are generated under the same conditions, the NMOS transistors 105, 106, and 107 can be turned on/off with the timing errors reduced.

Second Embodiment

Figure 6:
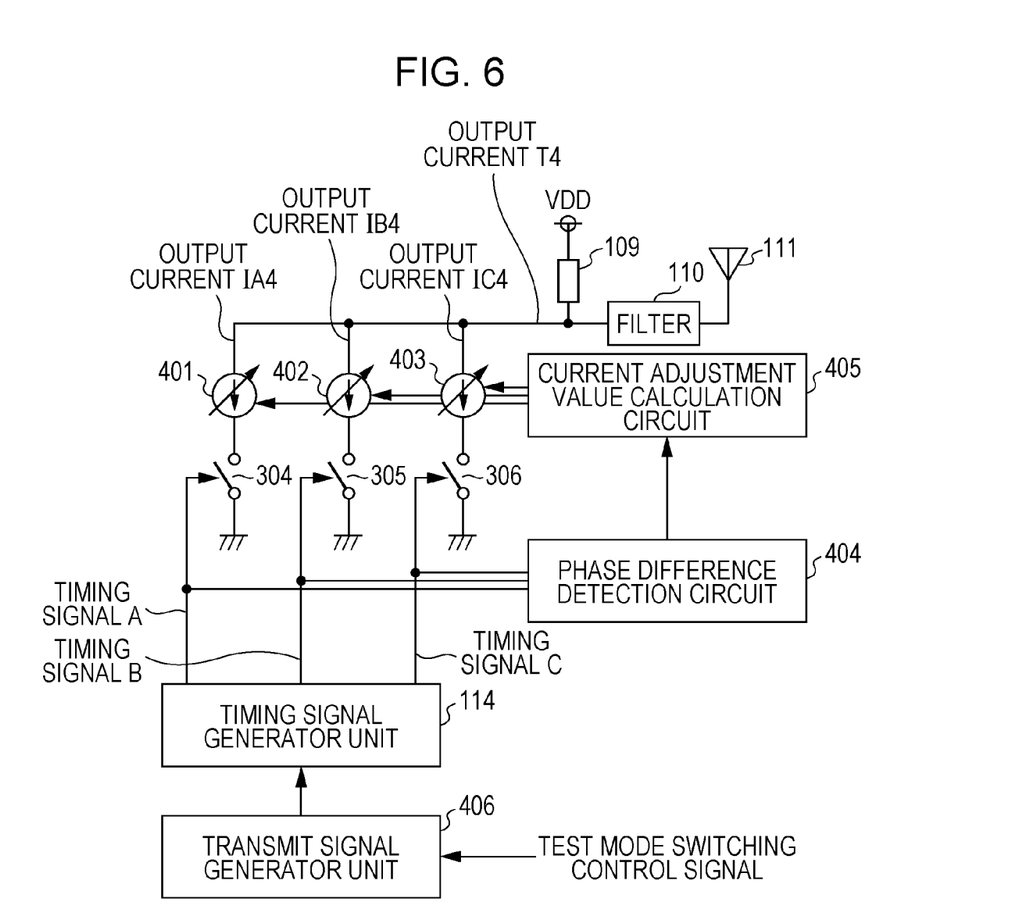
FIG. 6 illustrating a concept of a power amplifier according to a second embodiment of the disclosure.

FIG. 6 is a conceptual diagram illustrating a power amplifier according to a second embodiment of the disclosure. In FIG. 6, the same reference characters as those in FIG. 3 are used for components similar to those in FIG. 3 and description thereon is omitted.

As illustrated in FIG. 6, the power amplifier according to the second embodiment includes constant current sources 401, 402, and 403 in place of the current sources 301, 302, and 303 illustrated in FIG. 3. In addition to a configuration similar to that in FIG. 3, the power amplifier includes a phase difference detection circuit 404 as a detection unit, a current adjustment value calculation circuit 405 as a calculation unit, and a transmit signal generator unit 406, as illustrated in FIG. 6.

The constant current sources 401, 402, and 403 are configured so that ratio of currents flowing through the constant current sources 401, 402, and 403 may be $1:2^{1/2}:1$, as in the first embodiment. In the constant current sources 401, 402, and 403, into which control signals ordering adjustment in current values are inputted from the current adjustment value calculation circuit 405, the current values are set pursuant to the control signals. That is, the constant current sources 401, 402, and 403 are constant current sources that provide variable (adjustable) constant currents.

The phase difference detection circuit 404 detects phase differences among the plurality of timing signals. In FIG. 6, the phase difference detection circuit 404 detects phase difference α between the timing signal A and the timing signal B and phase difference β between the timing signal B and the timing signal C. The phase difference detection circuit 404 outputs the detected phase differences α and β to the current adjustment value calculation circuit 405.

The current adjustment value calculation circuit 405 calculates values for the adjustment in the values of the currents flowing through the constant current sources 401, 402, and 403 (hereinafter referred to as current adjustment values), based on the phase differences α and β inputted from the phase difference detection circuit 404. The current adjustment value calculation circuit 405 outputs the control signals, corresponding to the current adjustment values, to the constant current sources 401, 402, and 403.

The transmit signal generator unit 406 generates modulation waves and continuous waves while performing switching between the modulation waves and the continuous waves, in accordance with test mode switching control signals. Specifically, the transmit signal generator unit 406 is configured to output the continuous waves in periods when the currents in the power amplifier are adjusted.

Hereinbelow, a method of calculating the current adjustment values in the current adjustment value calculation circuit 405 will be described in detail.

Figure 7A:
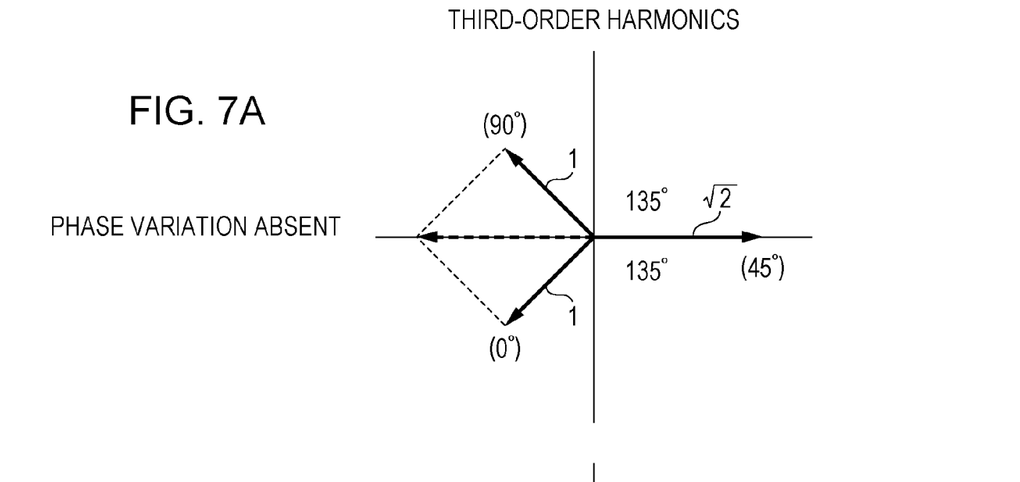
FIGS. 7A to 7C are provided for illustrating operations of the power amplifier according to the second embodiment of the disclosure.
Figure 7B:
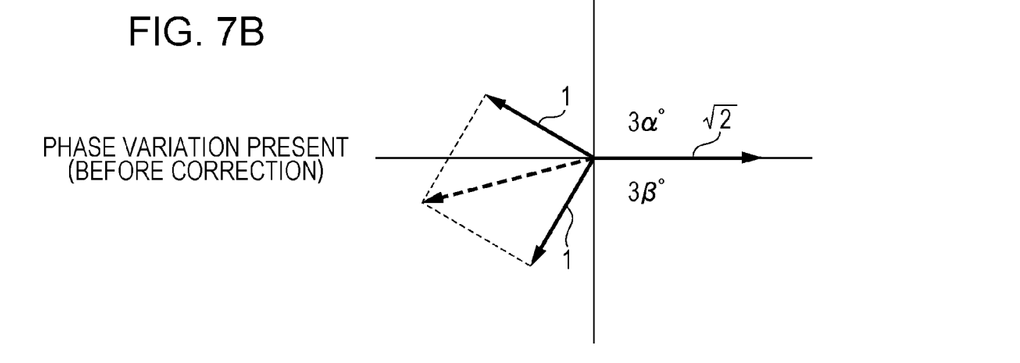
Figure 7C:
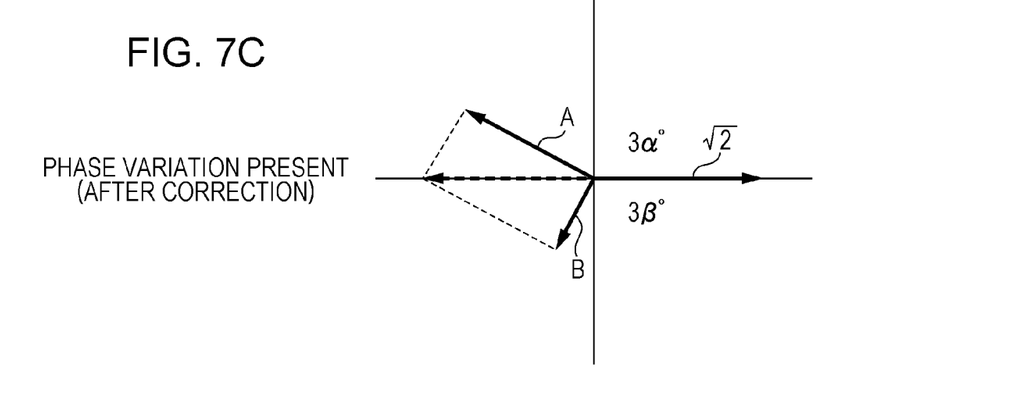

FIGS. 7A to 7C illustrate vectors of the third-order harmonics of the signals that have not yet passed through the filter 110 illustrated in FIG. 6, for instance.

The timing signals A, B, and C have the duty ratio of 50% and have the phase shifts therebetween of 45 degrees, as in the first embodiment. The timing signal A rises at the phase of 0 degrees, the timing signal B rises at the phase of −45 degrees, and the timing signal C rises at the phase of −90 degrees. Magnitude ratio of output currents IA4, IB4, and IC4 from the constant current sources 401, 402, and 403 is set to be $1:2^{1/2}:1$ in advance.

On condition that phase errors (phase variation) in the timing signals A, B, and C are negligibly small as illustrated in FIG. 7A, for instance, a relation among the third-order harmonics holds in which the three timing signals cancel out one another. The power amplifier obtains the output current while reducing the odd harmonics.

On condition that the phases of the timing signals A, B, and C are shifted from 0 degrees, −45 degrees, and −90 degrees, respectively, as illustrated in FIG. 7B, phase difference 3α (α is the phase difference between the timing signal A and the timing signal B) and phase difference 3β (β is the phase difference between the timing signal B and the timing signal C) between the vectors of the third-order harmonics are deviated from 135 degrees illustrated in FIG. 7A. As illustrated in FIG. 7B, the relation among the third-order harmonics does not hold in which the three timing signals cancel out one another. That is, it is difficult in FIG. 7B to obtain the output current of which the odd harmonics (third-order harmonics) are reduced even though the plurality of timing signals A, B, and C are used.

Therefore, the current adjustment value calculation unit 405 calculates the values for the adjustment in the current values for the constant current sources 401, 402, and 403 based on the phase differences among the plurality of timing signals A, B, and C. In FIG. 7C, for instance, the current adjustment value calculation unit 405 adjusts amplitude level of the timing signal A and amplitude level of the timing signal C in accordance with the phase difference α between the timing signal A and the timing signal B and the phase difference β between the timing signal B and the timing signal C. Specifically, relationships between the amplitude levels (A, B) and the phase difference (α, β) illustrated in FIG. 7C on condition that the three timing signals cancel out one another with regard to the third-order harmonics are represented by following expressions (1) and (2).

$$A \cos 3\alpha + B \cos 3\beta = \sqrt{2} \quad (1)$$

$$A \sin 3\alpha + B \sin 3\beta = 0 \quad (2)$$

That is, in an example illustrated in FIG. 7C, the current adjustment value calculation circuit 405 calculates the amplitude levels A and B of the timing signal A and the timing signal C with use of the phase differences α and β inputted from the phase difference detection circuit 404 so that the expressions (1) and (2) above are satisfied. The current adjustment value calculation circuit 405 sets the current adjustment values corresponding to the amplitude levels A, B that have been set up, for the constant current sources 401 and 403. As illustrated in FIG. 7C, the relation among the third-order harmonics in which the three timing signals cancel out one another is thus established.

As described above, the power amplifier according to the second embodiment obtains output current T4 of which the odd harmonics are reduced by use of the plurality of timing signals A, B, and C adjusted in the current values. Thus the power amplifier according to the second embodiment obtains the output current while reducing the odd harmonics by adjusting the current values (amplitude levels) of the timing signals when the phase differences among the plurality of timing signals A, B, and C is shifted from 45 degrees due to variation in production, for instance.

The power amplifier according to the second embodiment reduces the odd harmonics, caused by the shift in the phase differences, by adjusting the current values (amplitude levels) of the timing signals instead of adjusting the phases against the variation in the phase differences among the timing signals. In conventional phase adjusting circuits for correcting the phase differences, circuit scales are increased because varactor capacity of which capacity value is varied in accordance with voltage or capacitor bank in which switching among a plurality of capacity values is carried out is used therein. It is additionally anticipated that great variation in absolute value of the capacity value necessitates increase in adjustable range and thus causes further increase in the circuit scales. In the power amplifier according to the second embodiment, by contrast, the increase in the circuit scale can be avoided because the phase adjusting circuits may be omitted.

Figure 8:
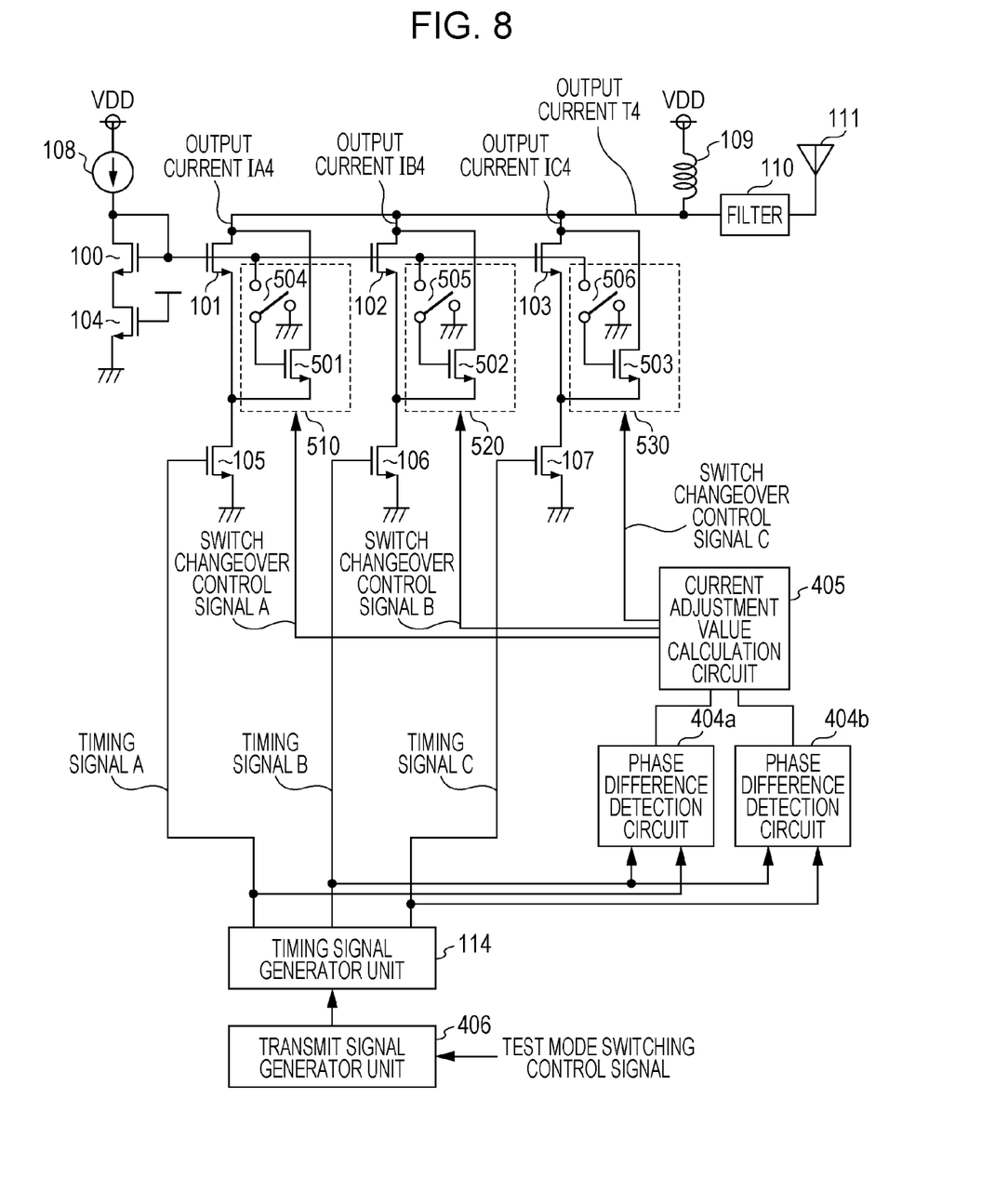
FIG. 8 illustrates a configuration of the power amplifier according to the second embodiment of the disclosure.

FIG. 8 is a specific configuration of the power amplifier according to the second embodiment. In FIG. 8, the same reference characters as those in FIG. 1 are used for components similar to those in FIG. 1 and description thereon is omitted. The power amplifier of FIG. 8 includes phase difference detection circuits 404a and 404b, the current adjustment value calculation circuit 405, the transmit signal generator unit 406, and current adjusting circuits 510, 520, and 530, in addition to a configuration similar to that of FIG. 1.

The current adjusting circuits 510, 520, and 530 include NMOS transistors 501, 502, and 503 and switches 504, 505, and 506, respectively.

Drain terminals of the NMOS transistors 501, 502, and 503 are connected to the drain terminals of the NMOS transistors 101, 102, and 103, respectively. Source terminals of the NMOS transistors 501, 502, and 503 are connected to the source terminals of the NMOS transistors 101, 102, and 103, respectively. The switches 504, 505, and 506 have one end connected to gate terminal of the NMOS transistor 100 through which a reference current flows and have the other end connected to gate terminals of the NMOS transistors 501, 502, and 503, respectively. The switches 504, 505, and 506 can be turned on/off independent of one another by switch changeover control signals A, B, and C inputted from the current adjustment value calculation circuit 405.

When the switches 504, 505, and 506 are turned on, current mirror circuits are configured by connection between the gate terminals of the NMOS transistors 501, 502, and 503 and the gate terminal of the NMOS transistor 100. When the switches 504, 505, and 506 are turned off, the gate terminals of the NMOS transistors 501, 502, and 503 are connected to ground for stabilization of voltages in the gate terminals.

The output currents IA4, IB4, and IC4 are totals of the output currents flowing through the drain terminals of the NMOS transistors 101, 102, and 103 and the output currents flowing through the drain terminals of the NMOS transistors 501, 502, and 503, respectively. That is, current values of the output currents IA4, IB4, and IC4 in the power amplifier according to the second embodiment can be adjusted by on/off operations of the switches 504, 505, and 506.

Namely, configurations ((100, 101, 510), (100, 102, 520), and (100, 103, 530)) composed of the current mirror circuits and the current adjusting circuits are used as the three variable constant current sources in the power amplifier illustrated in FIG. 8.

The phase difference detection circuit 404a detects the phase difference α between the timing signal A and the timing signal B. The phase difference detection circuit 404b detects the phase difference β between the timing signal B and the timing signal C. The current adjustment value calculation circuit 405 turns on/off the switches 504, 505, and 506 by the switch changeover control signals A, B, and C in accordance with the phase differences α and β and the current adjustment values for the current adjusting circuits 510, 520, and 530 are thereby set up.

Though the power amplifier that includes the transistors (501, 502, 503) for the current adjustment one by one has been described for FIG. 8, the power amplifier may include a plurality of transistors for the current adjustment and may switch connection to the transistors by the switches 504, 505, and 506 in order that adjustment width and adjustment accuracy may further be increased.

Figure 9:
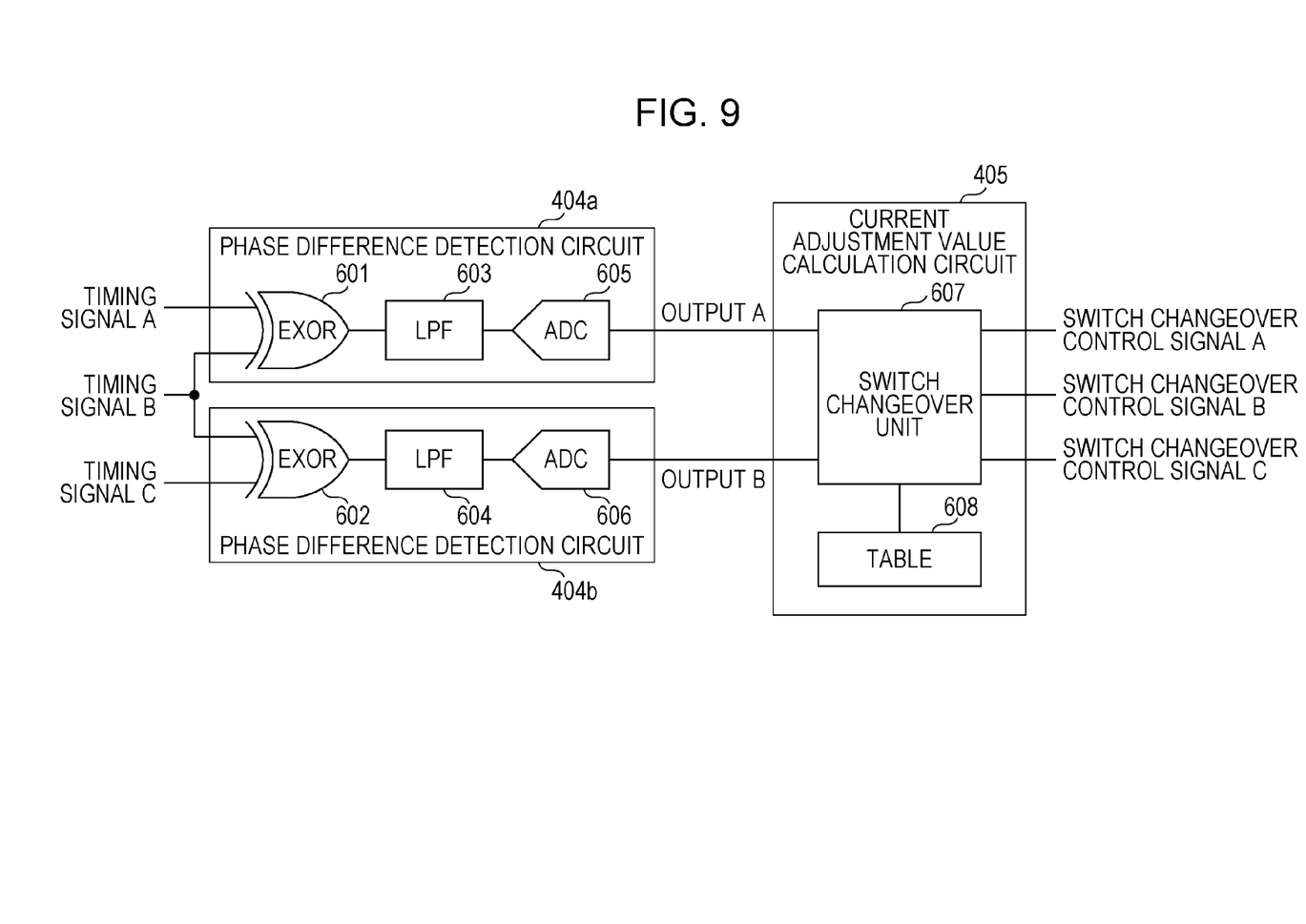
FIG. 9 illustrates internal configurations of phase difference detection circuits and a current adjustment value calculation circuit of the power amplifier according to the second embodiment of the disclosure.

FIG. 9 illustrates internal configurations of the phase difference detection circuits 404a and 404b and the current adjustment value calculation circuit 405 that are illustrated in FIG. 8.

The phase difference detection circuit 404a is composed of an exclusive OR (EXOR) circuit 601 as a first calculation unit, a low-pass filter (LPF) 603 as a first filter, and an analog-digital converter (ADC) 605 as a first conversion unit. Similarly, the phase difference detection circuit 404b is composed of an EXOR circuit 602 as a second calculation unit, an LPF 604 as a second filter, and an ADC 606 as a second conversion unit. The current adjustment value calculation circuit 405 is composed of a switch changeover unit 607 and a table 608.

In the phase difference detection circuit 404a, the EXOR circuit 601 performs EXOR operation for the timing signal A and the timing signal B, the LPF 603 smooths output signals from the EXOR circuit 601, and the ADC 605 converts the smoothed output signals into digital values and outputs the digital values as output A. In the phase difference detection circuit 404b, similarly, the EXOR circuit 602 performs EXOR operation for the timing signal B and the timing signal C, the LPF 604 smooths output signals from the EXOR circuit 602, and the ADC 606 converts the smoothed output signals into digital values and outputs the digital values as output B. The output values (digital values) A and B correspond to the phase differences α and β, respectively, between the timing signals.

The current adjustment value calculation circuit 405 stores data indicating a relationship between the phase differences α and β and values of the switch changeover control signals A, B, and C. The relationship is shown in a table 608 in which the phase differences α and β are associated with the values of the switch changeover control signals A, B, and C in advance, for instance. The switch changeover unit 607 refers to the data indicating the relationship (table 608) and determines the values (current adjustment values) of the switch changeover control signals A, B, and C that are associated with the output A, B (phase difference α, β) and that are to be outputted to the current adjusting circuits 510, 520, and 530.

Figure 10A:
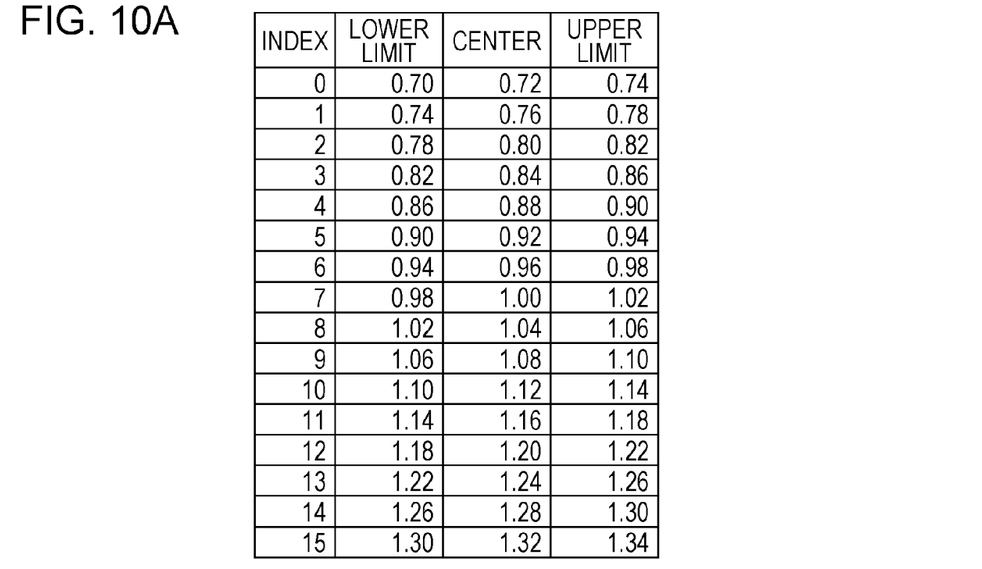
FIGS. 10A to 10C illustrate a table stored in the current adjustment value calculation circuit in the second embodiment of the disclosure.
Figure 10B:
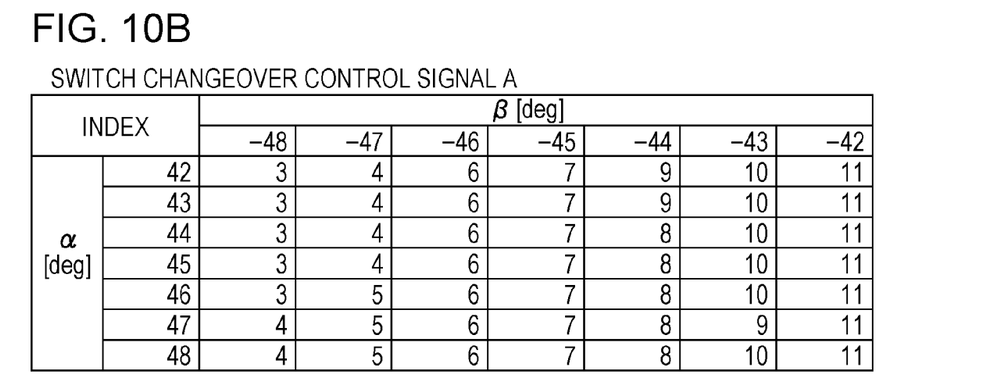
Figure 10C:
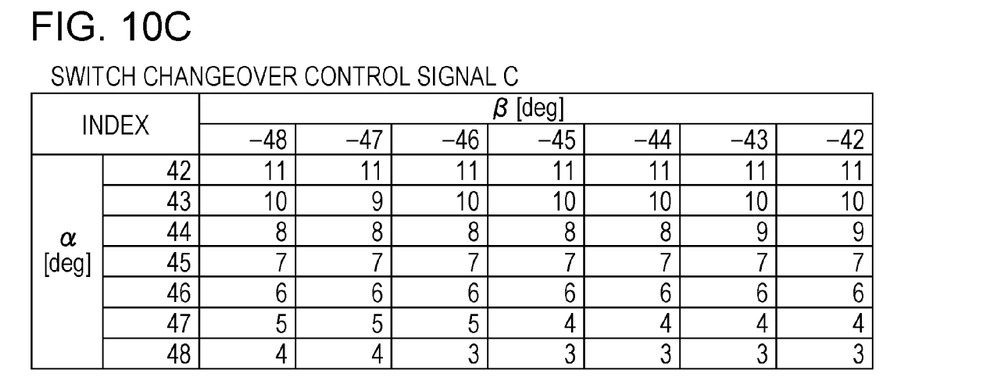

FIGS. 10A to 10C illustrate an example of the table 608. For FIGS. 10A to 10C, description will be given on the power amplifier in which the current values (amplitude levels A, B) of the timing signal A and the timing signal C are adjusted as illustrated in FIG. 7C. In the table 608, association between the phase differences α and β and the switch changeover control signal A (corresponding to the timing signal A) that is illustrated in FIG. 10B and association between the phase differences α and β and the switch changeover control signal C (corresponding to the timing signal C) that is illustrated in FIG. 10C are set up in advance. The value of the switch changeover control signal B corresponding to the timing signal B is fixed.

As illustrated in FIG. 10A, the switch changeover control signals can be expressed by setting values (INDEX) for the current adjusting circuits. FIG. 10A designates the current adjustment values for the setting values with 16-valued INDEX (0 through 15) and the current adjustment width of +32% (1.32 times) and −28% (0.72 times). That is, the table 608 illustrated in FIGS. 10B and 10C contains the current adjustment values associated with the phase differences α and β and converted into INDEX illustrated in FIG. 10A. Herein, the switch changeover control signal B is fixed at INDEX=7.

That is, the phase differences α and β and the current adjustment values are associated with each other in advance in the table 608 so that the three timing signals cancel out one another with regard to the third-order harmonics as illustrated in FIG. 7C (namely, so that the expressions (1) and (2) described above are satisfied).

Under conditions of the phase difference α=45 degrees and the phase difference β=−45 degrees (that is, a state illustrated in FIG. 7A in which the phase variation is absent), for instance, the switch changeover control signal A=7 and the switch changeover control signal C=7 are used. As illustrated in FIG. 10A, INDEX=7 signifies the current adjustment width of 0%, that is, no necessity for the adjustment.

Under conditions of the phase difference α=44 degrees and the phase difference β=−47 degrees, for instance, the switch changeover control signal A=4 and the switch changeover control signal C=8 are used. As illustrated in FIG. 10A, INDEX=4 signifies the current adjustment width of −12% and INDEX=8 signifies the current adjustment width of +4%. In comparison with a state prior to the adjustment, accordingly, the amplitude level of the timing signal A is decreased and the amplitude level of the timing signal C is increased.

The current adjustment value calculation circuit 405 may set the current adjustment values by using calculation formulae provided in the expressions (1) and (2), as described above, and the table 608 may be omitted.

As described above, the power amplifier according to the second embodiment can be reduced in size and enables the accurate adjustment in the current amplitude in the constant current sources. Thus deterioration in the reduction in the third-order harmonics can be prevented that may be caused by the phase errors, due to element variation, in the control signals which turn on/off the constant current sources.

The embodiments of the disclosure have been described above.

Though the power amplifiers that employ the three constant current sources have been described for the embodiments, the number of the constant current sources is not limited to three and the n constant current sources (n is an integer equal to or greater than three) may be used.

Blocks used for the description on the embodiments are typically embodied as ICs that are integrated circuits. The ICs may separately be provided as single chips or some or all of the ICs may be integrated on a single chip. Elements referred to as ICs herein may be referred to as LSIs, system LSIs, super LSIs, or ultra LSIs in accordance with degree of integration.

Technology of forming the integrated circuits may be achieved by use of dedicated circuits without limitation to ICs. Field programmable gate arrays (FPGAs) that are programmable after manufacture of the LSIs and/or reconfigurable processors in which connection or setting of circuit cells inside the LSI can be reconfigured may be used.

Furthermore, in a case where a new technology for forming integrated circuits that replace LSIs is developed as a result of progress in semiconductor technology or other technologies derived therefrom, the circuits may be integrated with use of such technology, as a matter of course. Such possibility may include application of biotechnology and the like.

The disclosure is useful for a power amplifier that drives an antenna, for instance.

What is claimed is:

1. A power amplifier comprising:
    n current sources (n is an integer equal to or greater than three) that provide variable constant currents;
    n switches that respectively open and close current paths for the n current sources;
    a generator that generates n timing signals that respectively turn on or off the n switches and that have same duty ratio and different phases;
    a detector that detects phase differences among the n timing signals; and
    a calculator that calculates current adjustment values for adjustment in current values for the n current sources based on the phase differences.

2. The power amplifier according to claim 1,
    wherein the n current sources include
        a reference current source that provides a reference current, and
        n current mirror circuits that transfer the reference current.

3. The power amplifier according to claim 1,
    wherein the calculator calculates the current adjustment values such that the n timing signals cancel out one another with regard to odd harmonics of a signal which is total of output signals of the n current sources.

4. The power amplifier according to claim 1,
    wherein the calculator sets the current adjustment values associated with the phase differences based on a relationship between the phase differences among the n timing signals and the current adjustment values.

5. The power amplifier according to claim 1,
    wherein the generator generates the n timing signals including a first timing signal, a second timing signal, and a third timing signal, phase of the second timing signal and phase of the third timing signal being set to be shifted by 45 degrees and 90 degrees, respectively, with respect to phase of the first timing signal,
    wherein a ratio of the current values for the n current sources is $1:2^{1/2}:1$ for the first timing signal, the second timing signal, and the third timing signal,
    wherein the detector detects first phase difference between the phase of the first timing signal and the phase of the second timing signal and second phase difference between the phase of the second timing signal and the phase of the third timing signal, and
    wherein the calculator calculates first current adjustment value for the first timing signal and second current adjustment value for the third timing signal based on the first phase difference and the second phase difference.

6. The power amplifier according to claim 5,
wherein the detector includes
- a first calculator that calculates exclusive OR for the first timing signal and the second timing signal,
- a second calculator that calculates exclusive OR for the second timing signal and the third timing signal,
- a first filter that smooths output signal from the first calculator,
- a second filter that smooths output signal from the second calculator,
- a first converter that obtains the first phase difference by converting signals output from the first filter into digital values, and
- a second converter that obtains the second phase difference by converting signals output from the second filter into digital values.

* * * * *